United States Patent [19]
Shannon et al.

[11] Patent Number: 5,105,255
[45] Date of Patent: Apr. 14, 1992

[54] MMIC DIE ATTACH DESIGN FOR MANUFACTURABILITY

[75] Inventors: Michael J. Shannon; Randolf C. Turnidge, both of Tucson, Ariz.

[73] Assignee: Hughes Aircraft Company, Los Angeles, Calif.

[21] Appl. No.: 463,187

[22] Filed: Jan. 10, 1990

[51] Int. Cl.⁵ .................. H01L 29/44; H01L 27/02
[52] U.S. Cl. .................................. 357/68; 357/40; 437/184; 437/209; 437/924
[58] Field of Search .............. 357/68, 40; 437/184, 437/924, 209

[56] References Cited

U.S. PATENT DOCUMENTS

| | | | |
|---|---|---|---|
| 3,568,307 | 3/1971 | Zanger et al. | 437/924 |
| 3,955,163 | 5/1976 | Novak | 437/924 |
| 4,656,055 | 4/1987 | Dwyer | 357/52 |
| 4,832,761 | 5/1989 | Geissberger et al. | 437/184 |
| 4,970,578 | 11/1990 | Tong et al. | |

Primary Examiner—Jerome Jackson, Jr.
Attorney, Agent, or Firm—R. M. Heald; C. D. Brown; W. K. Denson-Low

[57] ABSTRACT

An improved semiconductor device for use in microwave integrated circuits is disclosed. In particular, an improved monolithic integrated circuit (10) comprised of a semi-insulating substrate (12) and having an integrated circuit on a top surface (14) thereof. MMIC (10) is provided with free area (38) of a predetermined width extending along the entire periphery or at least two opposing sides and which is void of active circuitry. Free area (38) permits intimate mating contact with a die collet tool (58). Die collet tool (58) has a surface configured to matingly engage free areas (38) while avoiding contact with the active circuitry so as to avoid damage thereto. MMIC (10) permits application of high volume, automated manufacturing processes which previously could not be utilized.

7 Claims, 2 Drawing Sheets

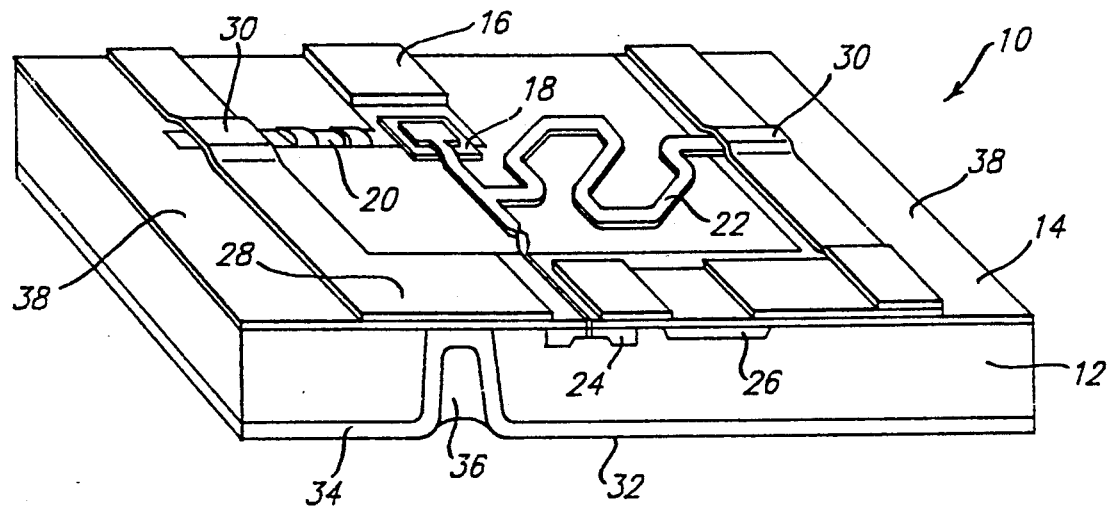
FIG. 1.
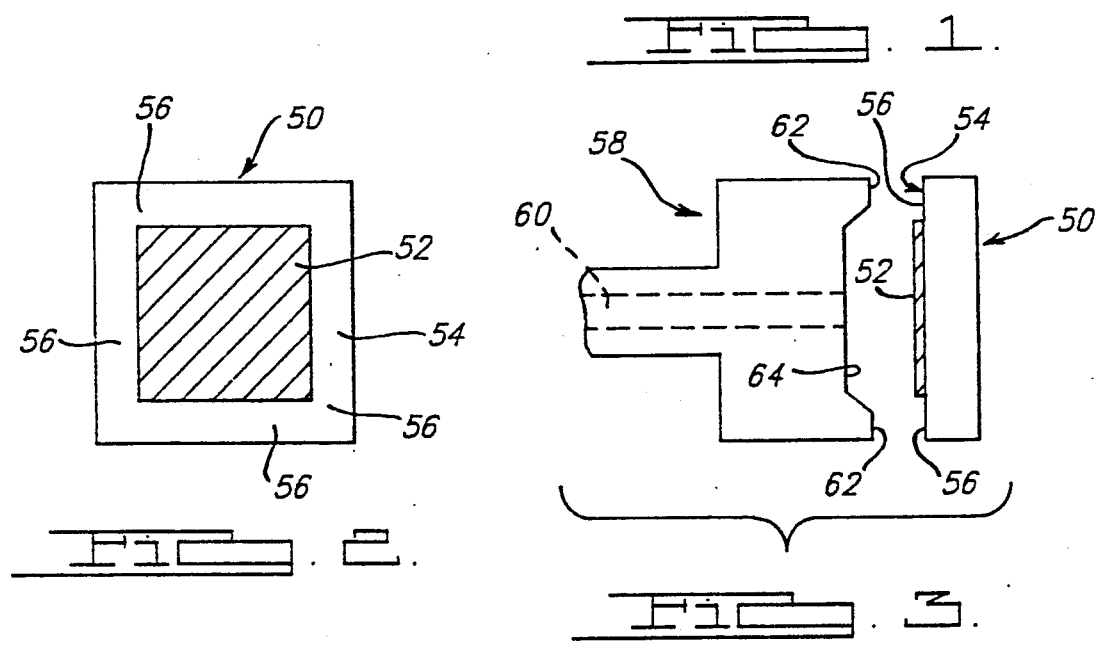
FIG. 2.
FIG. 3.
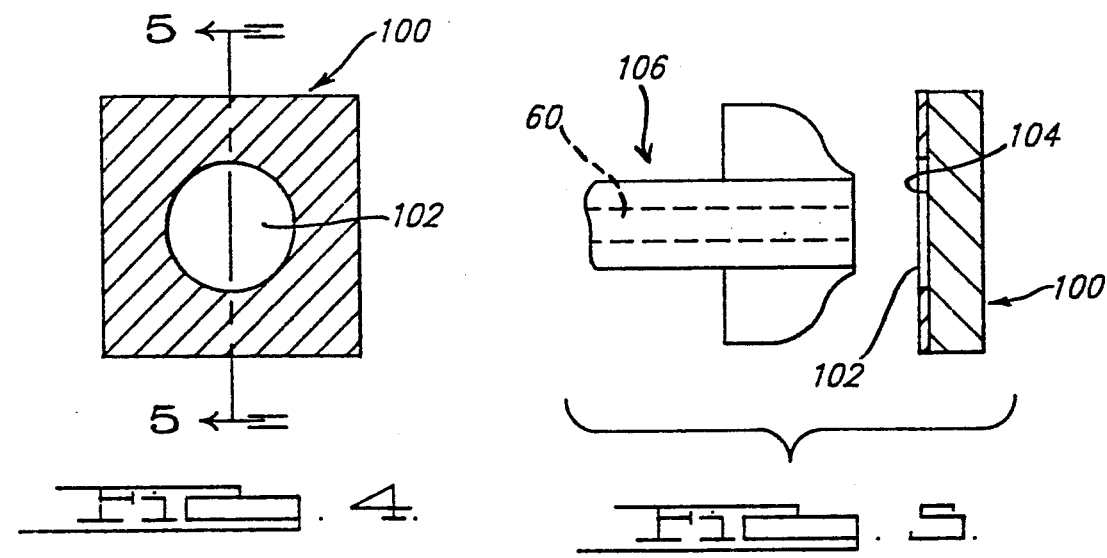
FIG. 4.
FIG. 5.

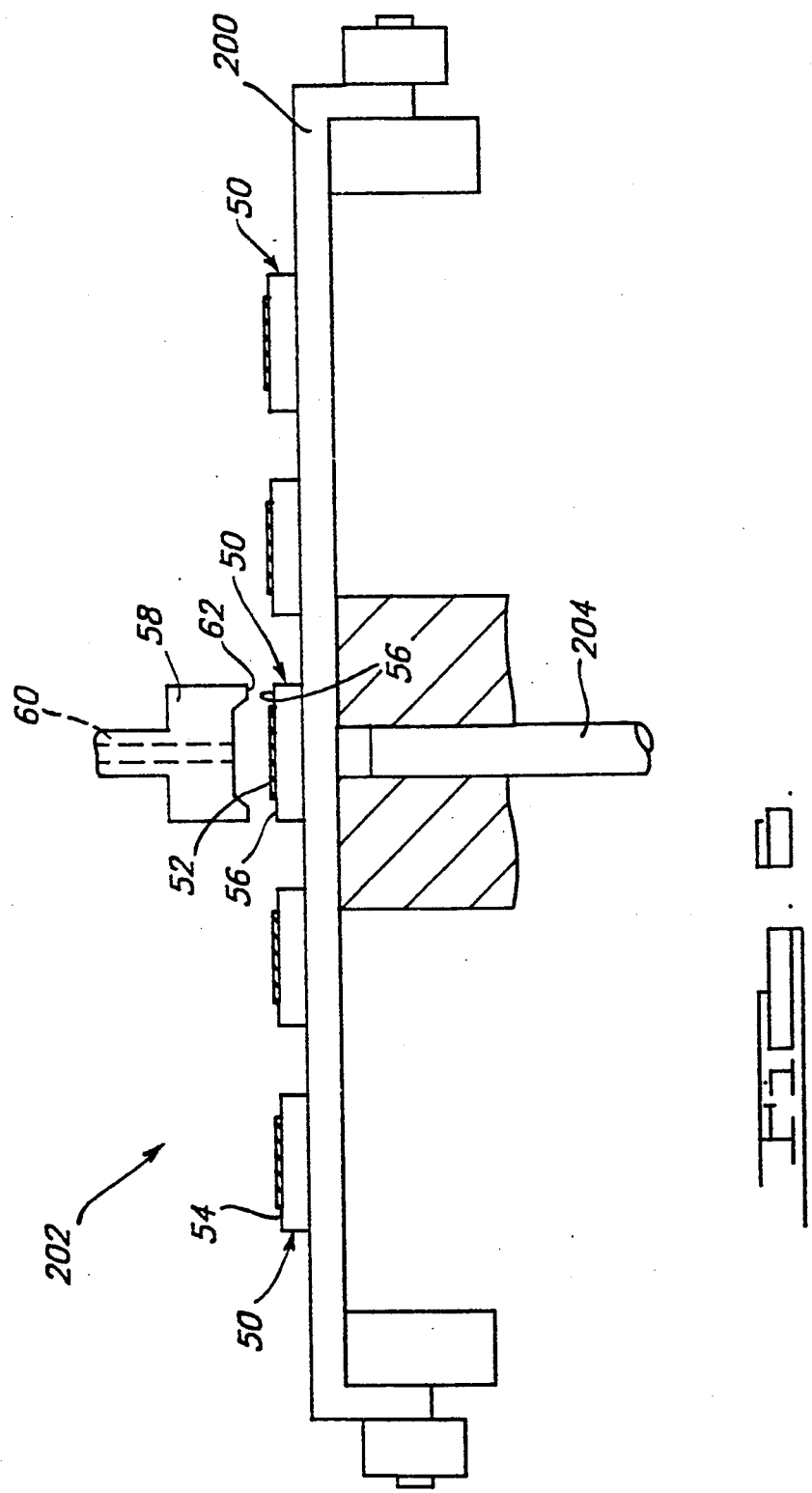

MMIC DIE ATTACH DESIGN FOR MANUFACTURABILITY

BACKGROUND OF THE INVENTION

1. Field of the Invention

This invention relates to semiconductor devices, and more particularly to monolithic microwave integrated circuit (MMIC) designs for improved manufacturability.

2. Discussion

Advances in semiconductor device technology have recently included the improvement in design and manufacturability of integrated devices and systems. For instance, one type of integrated device that recently has received increased attention is monolithic microwave integrated circuits (MMIC) for application in radar detection systems. Radar systems are often used in conjunction with munition and obstacle detection sensor systems for sensing electromagnetic radiation in the microwave frequency band. Specifically, the development of radar for future military defense systems will incorporate the use of electronically steered antennas (ESA) that offer improved beam agility, higher power and increased target range. The ESAs are comprised of an array of passive and active integrated circuits that transmit and receive the electronic radar signals. The transmit/receive (T/R) modules include microwave integrated circuits that are used by the thousands for each radar system and are a significant cost driver in the production of an affordable radar system.

In general, microwave integrated circuit devices are semiconductor devices fabricated by combining one or more semiconductor layers. Of the several conventional methods known, one method of fabricating microwave integrated circuits is to form a junction that includes a transition from a n-type (electron conduction) to a p-type (hole conduction) region. Typically, this can be accomplished by one or more methods such as formation of a junction by diffusion of dopants, ion implantation of dopants, or the growth of contiguous n-type and p-type layers. These methods, however, generally require the use of complex equipment and extensive processing steps. It follows then that the fabrication of typical microwave integrated circuit devices can be relatively expensive.

An alternative and relatively more simple junction formation technique involves forming a Schottky barrier, whereby a metal is deposited on a semiconductor layer. Because of some potentially adverse metal-semiconductor reactions, and sensitivities to surface conditions and small voltage steps obtainable particularly with n-type materials, the yield and quality of these devices has, until recently, been impractical for many microwave applications.

In recent years advances in MMIC design technology, including the use of gallium arsenide (GaAs) as a semiconductor, have limited the use of conventional automated equipment in microwave circuit assembly facilities. Microwave circuit assembly is considered to be very complex because gallium arsenide integrated circuits are significantly smaller and more delicate than conventional silicon integrated circuits. It is believed that no automated high volume fabrication or assembly facility currently exists for gallium arsenide integrated circuits. However, despite the manufacturability disadvantages of selecting gallium arsenide in lieu of silicon or other materials as the semiconductor substrate, numerous advantages are also apparent. The major advantage being that gallium arsenide integrated circuits have faster switching speeds of logic gates and significantly lower parasitic capacitance to ground.

Die-attach, the process for attaching a integrated circuit (die) to a substrate is one of the major processes for any hybrid or conventional silicon integrated circuit assembly line. In high volume circuit assembly facilities, automated die-attach machinery is used to pick integrated circuits, resistors, capacitors and various other components from their respective packages and place the components accurately onto a substrate material (e.g. alumina, polyimide).

Currently, microwave circuit assembly is extremely manually intensive since conventional die-attach equipment and tooling cannot provide the required precision, sensitivity or flexibility to control the thin, brittle gallium arsenide chips. Further, integrated-circuit fabrication technology rapidly becomes obsolete due to the steadily decreasing feature size of the individual circuit elements. Because of these rapid technological advances, even a conventional integrated circuit fabrication facility will remain state of the art in capability for no more than 3-5 years without the requirement of major equipment and process changes.

The mechanical properties of gallium arsenide are well below that of silicon in hardness, fracture toughness and Young's modulus. Gallium arsenide is very brittle, about one-half as strong as silicon. This means that a much greater degree of process control is mandated to ensure reliability and repeatability necessary to cost-effectively produce microwave frequency circuits that use gallium arsenide MMICs.

Additionally, gallium arsenide MMIC technology requires that the electrical grounding paths be very short. Therefore, gallium arsenide wafer thinning is employed to reduce the thickness of MMIC wafers to approximately 0.004" to 0.010" thick. Conventional integrated circuits have a semiconductor layer thickness in the range of 0.015" to 0.030". Following, the MMIC wafer thinning processing, a through-substrate via etching process is then performed to form a ground path directly through the chip to circuitry loaded on the top of the MMIC surface. The top surface of the MMIC has electrical conductors that delineate circuitry capable of operating at microwave frequencies. In many cases, these conductors are made into structures called air bridge crossovers. Typically, air bridges are located at the field effect transistors (FETs) and at various capacitors located on the MMIC surface. Routinely, the air bridge cross-overs are densely packed in close proximity on the MMIC top surface. These air bridge crossovers can be easily damaged and as such are not accessible to conventional high rate circuit assembly techniques.

One conventional die-attach process includes the use of a vacuum and die collet tooling that matingly contacts the top surface of the integrated chip during pick up and placement. This would prove to be unacceptable for MMIC die-attach because of the brittleness of the gallium arsenide and the delicacy of the air bridge crossovers.

Conventional die-attach processes makes use of a relatively thin passivation layer on the top surface of the inorganic semiconductor which acts as a barrier to protect the circuitry during processing. Typically, the passivation layer includes a relatively thin protective overglass layer disposed on the top surface of the integrated circuit. For instance, the overglass layer may be a silicon oxide (SiO), silicon dioxide (SiO$_2$), silicon nitride (SiN$_x$), aluminum oxide (Al$_2$O$_3$), or the like. Because passivation on a surface of conventional silicon integrated circuits is usually quite tenacious, many grams of force can be exerted on the integrated circuit surface without causing even the slightest visible damage or effecting functional performance. For this reason, conventional die-attach can be done very quickly and economically for many sizes of circuit chips that are fairly thick (typically 0.015" to 0.030"). Unfortunately, this is not the case with gallium arsenide semicondutors. The relatively thin overglass passivation layer commonly employed with silicon circuits cannot adequately protect the fragile air bridges. Further, these thin passivation layers are undesirable since they detrimentally attenuate microwave signals.

The present invention provides an improved MMIC design which permits automated die-attach and assembly processing for low cost, high volume transmit/receiver module production. Likewise, the present invention provides an improved MMIC die-attach method promoting more efficient high rate manufacturability and assembly. The fragile nature of gallium arsenide MMIC strongly warrants that these methods be employed to reduce the amount of handling required to get the chips from MMIC fabrication to the MMIC assembly processes.

SUMMARY OF THE INVENTION

An improved semiconductor device for use in microwave integrated circuits is disclosed. The semiconductor device includes a relatively thin semiconducting wafer. Circuitry is formed on a predetermined portion of a major surface of the semiconductor wafer so as to define at least one preselectively exposed area thereon. The exposed area is provided to permit intimate mating engagement with a work handling apparatus configured to avoid contact with the circuitry.

BRIEF DESCRIPTION OF THE DRAWINGS

Various advantages of the present invention will become apparent to one skilled in the art upon reading the following specification and references to the drawings in which:

FIG. 1 is a perspective view of an improved monolithic microwave integrated circuit (MMIC) according to a first preferred embodiment;

FIG. 2 is a diagrammatic top view illustration of a improved MMIC design according to a second preferred embodiment;

FIG. 3 is a diagrammatic illustration of the die tool associated with the die-attach process in accordance with the MMIC shown in FIGS. 1 and 2;

FIG. 4 is a diagrammatic top view illustration of a top view of a third embodiment of an improved MMIC design;

FIG. 5 is a diagrammatic illustration of the die tool design associated with the die-attach process for the MMIC shown in FIG. 4; and FIG. 6 is a diagrammatic illustration of a preferred MMIC die-attach process.

DETAILED DESCRIPTION OF THE PREFERRED EMBODIMENTS

Typically, integrated circuits for use in electromagnetic radar systems have been fabricated from silicon having an average semiconductor layer thickness ranging between 0.015" through 0.030". Conventionally, relatively thin passivation layers have been provided on the surface of the integrated circuits which permits a direct die contact with the surface of the integrated circuit during pick and place positioning and assembly. Unfortunately, such conventional processing is not compatible with gallium arsenide (GaAs) monolithic microwave integrated circuits (MMICs) that are used in microwave frequency modules. Gallium arsenide is very brittle, at about only one half the strength of silicon. To provide optimal performance, electrical grounding paths of the gallium arsenide MMICs must be extremely short. As such, wafer thinning of the gallium arsenide layer is employed to reduce the thickness "t" of the MMIC wafer to approximately 0.004" to 0.007" of thickness.

It is known that conventional die-attach tooling and processes cannot be employed for attaching gallium arsenide MMICs to substrates and/or for circuit assembly purposes. Specifically, very thin integrated chips and fragile air bridge crossovers prevent die collects from making direct mating contact with the active circuitry on a top surface of the MMIC for pick and place thereof. Existing MMIC die-attach processes are manually intensive with low line rates and high scrap levels.

Referring now to FIG. 1 a monolithic microwave integrated circuit (MMIC), according to a first preferred embodiment, is generally designated as 10. The MMIC 10 is comprised of a semi-insulating substrate 12 which is preferably fabricated from gallium arsenide. On a top planar surface 14 of MMIC 10 various electrical circuits and components are provided. These include an input line 16, a silicon nitride dielectric 18, a thin film resistor 20, inductive lines 22, gallium arsenide field effect transistor (FET) 24, and implanted resistors 26. Further, top surface 14 of the MMIC 10 has electrical conductors 28, preferably fabricated from gold, that delineate the aforementioned circuitry, all of which are capable of operating at microwave frequencies. Typically, these gold conductors 28 are made into structures referred to as air bridge crossovers 30.

A bottom planar surface 32 of MMIC 10 includes an electrically conductive ground-plane metallization layer 34 preferably fabricated from an electroplated gold. The metallization layer 34 also promotes "wetting" of the solder alloy thereto during solder die-attach processing. A plurality of through-chip vias 36 extending through substrate 12 are provided on the metallized layer 34 for permitting ground contacts to various locations on the surface of the MMIC and its gold metallized structures. The primary purpose of vias through the chip is to provide very short ground paths to the circuitry on the MMIC surface. The secondary point is that gold surfaces can be used for solder attachment processes.

The through chip vias 36 are formed through chemical etching or reactive ion etching. Chemically etched vias are fairly large and have smooth surfaces. In contrast, the reactive ion etched vias are smaller and have rough and irregular surfaces. Reactive ion etching is desirable when tighter field effect transistor (FET) spacings are required on surface 14 of the MMIC chip.

Die-attach processing includes bonding MMIC to another substrate using either an electrically conductive epoxy material or a metallic solder alloy. The preferable solder alloy compositions include 80/20 gold-tin and 50/50 lead-indium. It is to be understood that any solder material having suitable characteristics can be used. Solder die-attachment is preferable in applications requiring dissipation of heat generated during high duty cycle operation of a MMIC.

Improper MMIC solder die-attach can result in reduced electrical and mechanical performance. Therefore, voiding within the solder bondline must be kept to a minimum to maintain the uniform and continuous electrical conductive paths and to maintain uniform and continuous thermal paths.

The improvement over the art resides in MMIC 10 providing at least one preselectively exposed free area. Specifically, free areas 38 are located at opposite peripheral edges of top surface 14 and which are void of any circuitry. Application and utilization of free areas 38 on MMIC 10 will be hereinafter described in greater detail.

While the circuitry illustrated on top surface 14 in FIG. 1 is representative, it is not intended to limit the invention disclosed herebefore. Any integrated circuit configuration, regardless of componentry or application, is susceptible to adaptation of the present invention.

In reference now to FIG. 2, a second improved MMIC 50 structure is diagrammatically illustrated. The cross-hatched region 52 provided on top surface 54 of MMIC 50 represents that area having circuitry located thereon. Specifically, two pair of opposing exposed areas 56 are provided which extend around the entire perimeter of MMIC 50, and which are void of active circuitry.

Free areas 38 (FIG. 1) and 56 (FIG. 2) are preferably between 0.005" and 0.015" in width, and even more preferably within the range of between 0.007" and 0.010". Die targeting and tolerances can be less precise thereby permitting higher rate assembly processing if additional free area is provided. However, it is contemplated that the width required is directly related to the applicable tool design and the sensitivity of optics, pattern recognition and machine repeatability of the die-attach process.

In this light, FIG. 3 provides a diagrammatical illustration of a two-sided channel collet die tool 58 having a vacuum line 60 centrally provided therein. The free areas 38 (FIG. 1) and 56 (FIG. 2) permit intimate die collet contact between tool surfaces 62 and the respective free areas during pick up and placement of the MMIC while avoiding damage to the delicate air bridge crossovers and related electronics. Collet 58 is designed to provide a recessed central region 64 having a depth which is greater than the thickness of active electrical components and circuitry on MMIC top surface. Variable vacuum air pressure regulation, as is well known in the art, can be utilized to provide adequate holding forces during all degrees of motion of MMIC 10 and 50 during processing. However, it is contemplated that the die tool design will be adapted to accommodate the packaging scheme and the level of automation required with any particular MMIC configuration.

A third embodiment is shown in reference to FIGS. 4 and 5. Herein, MMIC 100 is provided with free area 102 in a general centralized section of the top surface 104. In this manner, compliant collet tool 106, shown in FIG. 5, makes intimate die contact during pick up and placement of MMIC 100 without damaging the active circuitry surrounding free area 102. This embodiment closely resembles, and is compatible with, conventional die-attach processing.

Preferably, the die collets 58 or 106 are incorporated into a die-attach process similar to that illustrated in FIG. 6. Typically, die-attach processing requires a semi-automatic computer-controlled system. The semi-automatic system preferably includes a computer controlled die-bonder having a suitably sized workstation for holding substrates, a multi-position rotatable die-collet holder, and a CCTV system used for vision scanning during die pick-up and placement. The system further includes a 360° pattern recognition system, servo-controlled Z-axis drive system, and a computer controlled X-Y table drive system for die presentation. Such a die-attach processing system provides greater process flexibility with reduced operator intervention.

As illustrated in FIGS. 2 and 6, die bonding of MMIC 50 is accomplished by placing an expanded die matrix 200 onto a table drive system 202 which will position MMIC 50 under die collet 58 for pick-up. Available semiconductor chip packaging includes waffle pack, gel pak, tape, and expanded matrix wafer presentation methods. Waffle packs are the industry standard, but expanded matrix wafer and tape presentation systems are preferred for high circuit assembly operations because die location is generally more precise and repeatable.

A small ejector 204 pushes MMIC 50 up from its bottom surface toward die collet 58 which is moving toward top surface 54 of MMIC 50. Intimate mating contact is made between die collet 58 and free areas 52 provided on MMIC top surface 54. Vacuum line 60 generates "suction-type" forces between the mating surfaces 56 and 62 to securely hold MMIC 50 against die collet 58. Die collet 58 is then transferred to a substrate holding work station (not shown). The die collet 58, which is holding MMIC 50 in a predetermined orientation, is lowered so as to place MMIC 50 onto the substrate. The vacuum is then removed to release MMIC 50 from die collet 58. MMIC 50 is thereafter bonded, either adhesively or metallurgically, to the substrate. As is readily apparent, die-attach processing of MMIC 10, designed in accordance with the first preferred embodiment, would be identical to that herebefore described. Likewise, die-attach processing of MMIC 100 utilizing die collet 106 would be substantially identical to that herebefore described.

The improved MMIC designs permits utilization of currently available die-attach equipment. More particularly, specific emphasis is placed on the ability to produce the MMIC circuits using existing fully automated assembly and test systems. Additionally, it is contemplated that the MMICs will be assembled within a computer integrated manufacturing (CIM) facility to afford a high level of process repeatability and to facilitate data collection.

If the identity of the individual MMIC chip is maintained during the assembly and testing sequence, such data can be used to greatly reduce additional test and calibration steps at subsequent "next level" installation or assembly. Preferably the on-wafer MMIC location and test parameters are stored on a host computer and used for selective circuit matching at the die-attach station.

Likewise, it is believed that, as technology in the integrated circuit industry progresses, the overall size of semiconductor chips will decrease with an increase in demanded electrical sensitivity and circuit complexity. Therefore, the aforementioned circuit pick and place transfer method can be readily adapted for use to transfer semiconductor devices releasably secured to a sacrificial mounting platform. To protect delicate circuitry and/or the semiconductor itself, mating contact can be made between the die collet and the mounting platform during transfer operations.

Although the invention has been described with particular reference to certain preferred embodiments thereof, variations and modifications can be effected within the spirit and scope of the following claims.

What is claimed is:

1. A semiconductor device comprising:
    a wafer of semiconducting material having a first major top surface, a second major bottom surface and a plurality of side surfaces extending between said top and bottom surfaces;
    circuitry on a predetermined portion of said first major surface o said wafer defining preselectively exposed areas on opposite sides of said circuitry, said areas extending substantially parallel to one another and having a width of about 0.007" to about 0.009" whereby said first major top surface provides mating engagement with a work handling apparatus configured to avoid contact with said circuitry.

2. A semiconductor device accordding to claim 1 wherein said wafer is a gallium arsenide semiconductor wafer.

3. A semiconductor device according to claim 2 wherein said circuitry is an electrical integrated circuit formed on said first major surface of said gallium arsenide semiconductor wafer, said electrical integrated circuit capable of operation within the microwave frequency spectrum.

4. A semiconductor device according to claim 3 wherein said semiconductor device has a thickness of about 0.004" to about 0.010".

5. A semiconductor device according to claim 1 wherein said preselectively exposed areas are provided along opposite peripheral surfaces of said wafer.

6. A microwave integrated circuit device, comprising:
    a wafer of semiconducting material having a first major top surface, a second major bottom surface and a plurality of side surfaces extending between said top and bottom surfaces;
    said semiconductor wafer made of a layer of gallium arsenide;
    an integrated circuit formed on said top surface of said semiconductor wafer defining preselectively exposed areas on opposite sides of said integrated circuit, said exposed areas extending substantially parallel to one another and having a width of about 0.005" to about 0.015";
    at least one via extending transversely through said semiconductor layer from said second major bottom surface of said semiconductor wafer to said first major top surface; and
    an electrically conductive layer formed on said second major bottom surface on said via and interfacing with said integrated circuit for providing a conductive path between said integrated circuit and said second major bottom surface.

7. A microwave integrated circuit device according to claim 6 wherein said semiconductor wafer is made of a layer of gallium arsenide having a thickness of at least about 0.004" to at least about 0.007".

* * * * *